United States Patent [19]
Wang et al.

[11] Patent Number: 5,591,664
[45] Date of Patent: Jan. 7, 1997

[54] METHOD OF INCREASING THE CAPACITANCE AREA IN DRAM STACKED CAPACITORS USING A SIMPLIFIED PROCESS

[75] Inventors: Chen-Jong Wang; Jin-Yuan Lee, both of Hsin-Chu, Taiwan

[73] Assignee: Taiwan Semiconductor Manufacturing Company Ltd., Hsin-Chu, Taiwan

[21] Appl. No.: 618,618

[22] Filed: Mar. 20, 1996

[51] Int. Cl.$^6$ .............................................. H01L 21/8242
[52] U.S. Cl. ............................ 437/60; 437/47; 437/919; 437/233
[58] Field of Search ........................... 437/47, 60, 195, 437/919, 233

[56] References Cited

U.S. PATENT DOCUMENTS

| | | | |
|---|---|---|---|
| 5,286,668 | 2/1994 | Chou | 437/60 |
| 5,374,577 | 12/1994 | Tuan | 437/60 |
| 5,416,037 | 5/1995 | Sato et al. | 437/47 |
| 5,441,909 | 8/1995 | Kim | 437/60 |
| 5,459,094 | 10/1995 | Jun | 437/60 |

*Primary Examiner*—Chandra Chaudhari
*Attorney, Agent, or Firm*—George O. Saile

[57] ABSTRACT

A method is achieved for fabricating a dynamic random access memory (DRAM) storage capacitors having increased capacitance and reduced processing complexity. The capacitor bottom electrodes are made from a multilayer composed of alternately doped and undoped polysilicon layers formed by in-situ doping in a single LPCVD deposition step. The substrate is processed sequentially in the same etching chamber to pattern the multilayer in the RIE mode and then isotropically plasma etch to recess the doped polysilicon layer in the sidewalls of the multilayer. The recessing increases the surface area of the capacitor bottom electrode. The stacked storage capacitors are completed by forming a thin high dielectric constant insulator on the bottom electrode and a top polysilicon electrode. The method reduces processing complexity and manufacturing cost while providing capacitors with increased capacitance.

23 Claims, 4 Drawing Sheets

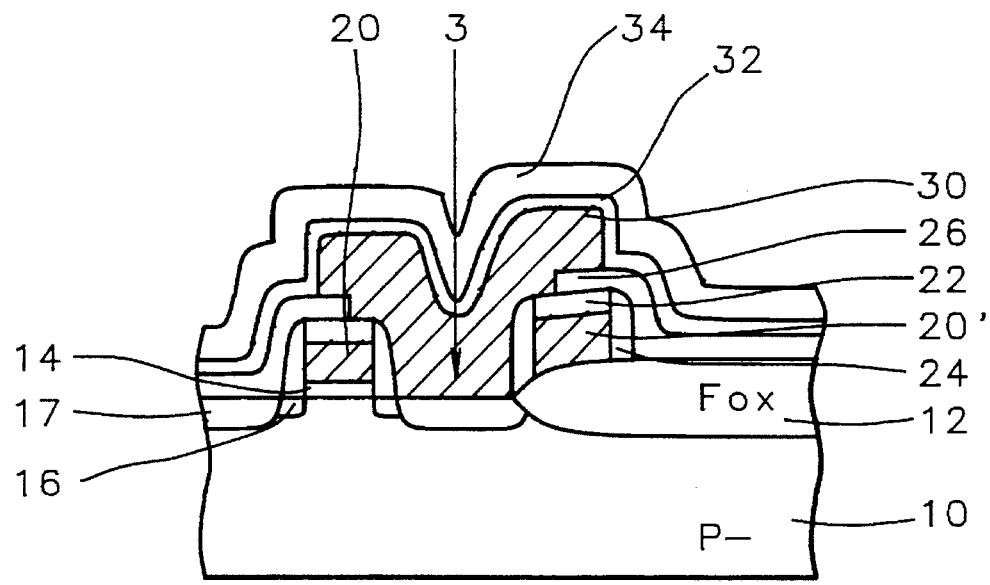
FIG. 1 — Prior Art
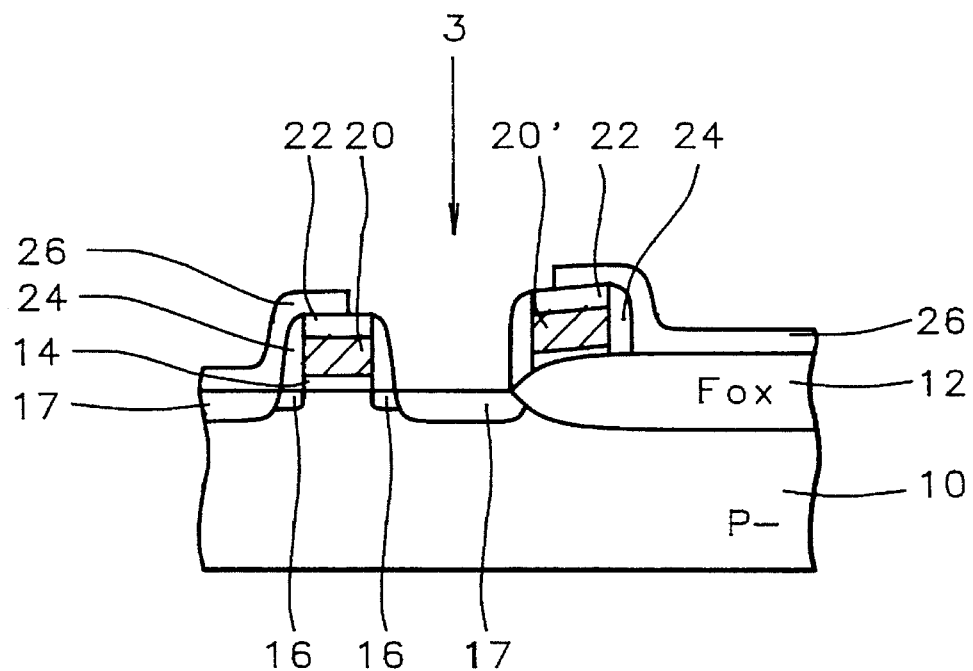
FIG. 2

METHOD OF INCREASING THE CAPACITANCE AREA IN DRAM STACKED CAPACITORS USING A SIMPLIFIED PROCESS

BACKGROUND OF THE INVENTION (1) Field of the Invention

The present invention relates to the fabrication of a dynamic random access memory (DRAM) device, and more particularly to a method for fabricating polysilicon multilayer stacked capacitors for DRAM cells using a cost-effective dry etching process.

(2) Description of the Prior Art

Dynamic random access memory (DRAM) devices are used for storing digital information. The DRAM consists of an array of memory cells which are accessed by peripheral circuits on the chip for randomly reading and writing information to and from the individual memory cells. The most common memory cell consists of a single current pass transistor, typically a field effect transistor (FET), and a single storage capacitor. With increased circuit density and reduced cell size the capacitor area decreases, and it is important in the DRAM technology to maintain or increase the capacitor area to provide sufficient signal-to-noise margins and reasonable refresh cycle times.

Recently, stacked storage capacitors have drawn considerable attention because they can be built over the FET in a variety of ways to substantially increase the surface area of the capacitors. However, these stacked capacitors generally require additional processing steps and are more costly to manufacture, compared to the more conventional process for making flat stacked capacitors. A schematic cross-sectional view of a simple DRAM cell having a flat stacked capacitor by the prior art is shown in FIG. 1. The DRAM cell consists of a field effect transistor formed from a gate oxide 14, a polysilicon gate electrode 20, lightly doped source/drains 16 and source/drain contact areas 17. Formed concurrently from the same polysilicon layer 20 are the word lines 20' on the field oxide (FOX) 12. A first insulating layer 22 and sidewall spacers 24 insulate the gate electrodes 20 (and word lines 20'). Self-aligned contact openings 3 are etched in a second insulating layer 26 to form the capacitor node contact. A second polysilicon layer is deposited and patterned to form the bottom electrode 30 for the flat stacked capacitor. A thin insulating layer 32 having a high dielectric constant is formed on the bottom electrode 30 and a polysilicon top electrode 34 is deposited and patterned to complete the flat capacitor on the DRAM cell.

Several methods of making more complex stacked capacitors with still more capacitance are reported in the literature. For example, Sato et al., U.S. Pat. No. 5,416,037, teaches a method for making a multilayer stacked capacitor using a multilayer of undoped polysilicon and oxygen-rich polysilicon in which the oxygen-rich polysilicon is selectively and isotropically etched to form a fin-like capacitor. In U.S. Pat. No. 5,441,909, Kim describes another method for making a fin-shaped capacitor by depositing and patterning a polysilicon layer over a sacrificial oxide layer composed of phosphosilicate glass (PSG). The oxide is then removed to form a fin-like bottom electrode capacitor structure. Kim further deposits a second polysilicon layer and etches back to form a double-fin structure. Still another method of making stacked capacitors is taught by Chou in U.S. Pat. No. 5,286,668, in which a second embodiment is described using a multilayer comprised of an undoped polysilicon, a doped polysilicon and another undoped polysilicon. The polysilicon layers are deposited sequentially and the second layer is in-situ doped during the deposition. The multilayer is then patterned to form the bottom electrode of the capacitor, and the doped polysilicon is then etched in a hot phosphoric acid solution to selectively remove portions of the doped polysilicon to form a double-fin-shaped structure. However, this wet-etch process requires moving the wafers from one dry processing system to a wet station, which increases the probability of contamination and increases process time and manufacturing cost.

Therefore, there is a strong need in the industry to reduce the manufacturing cost by eliminating the wet-etch processes in favor of dry-etch processes and for automating the process in multichamber processing. The use of dry etching eliminates large volumes of waste chemicals and costly reclamation systems, and further reduces manufacturing costs.

SUMMARY OF THE INVENTION

It is a principal object of the present invention to provide a method for making a stacked storage capacitor for DRAM circuits having increased capacitance using a more cost-effective manufacturing process.

Another object of this invention is to provide this improved manufacturing process by using a dry-etch processes that are sequentially performed in a single etch chamber or in a multichamber system (cluster tool), thereby reducing process complexity.

The method for fabricating a dynamic random access memory device having stacked storage capacitors starts by providing a substrate. The substrate for DRAM applications is typically composed of a single-crystal silicon that is lightly doped with a P-type dopant. Field OXide (FOX) areas are formed on and in the silicon substrate surface to surround and electrically isolate device areas in which the field effect transistors are built. The most commonly used field oxide is formed by the method of LOCal Oxidation of Silicon (LOCOS) wherein a patterned silicon nitride layer is used as an oxidation mask over the device areas, and the field oxide areas are then thermally oxidized by steam oxidation. The silicon nitride layer is removed and a thin gate oxide is thermally formed on the device areas. Next, a first polysilicon layer is deposited, followed by depositing a first insulating layer, which are patterned to form the gate electrodes on the device arean and the interconnecting word lines on the FOX for the array of DRAM cells. The first insulating layer over the gate electrodes facilitates the formation of the self-aligned node contacts that are later formed. The lightly doped drain areas are formed next by ion-implanting an N-type dopant adjacent to the gate electrodes, wherein the gate electrode serves as a block-out mask for the implant alignment. Next, sidewall spacers are formed on the sidewalls of the gate electrodes by depositing a conformal insulating layer and etching back anisotropically to the substrate surface in the device areas. The source/drain contact areas for the FETs are now formed adjacent to the sidewall spacers by a second ion implantation, thereby heavily doping the substrate and forming highly N-type conductive N-type regions. This completes the FETs for the DRAM memory cells.

The stacked storage capacitors for the DRAM cells are now formed by the method of this invention. Continuing, a blanket second insulating layer is deposited over the substrate to electrically insulate the source/drain areas of the FETs. Node contact openings are etched to one of the two source/drain contact areas of each FET in the array of memory cells. The bottom electrode for the stacked capacitors is now made by consecutively depositing in the same deposition chamber a multilayer consisting of a second undoped polysilicon layer, a third doped polysilicon layer, and a fourth undoped polysilicon layer on the second insulating layer and in the node contact openings. The multilayer is deposited in a low-pressure chemical vapor deposition (LPCVD) system, wherein the third polysilicon layer is heavily doped with N-type impurities by adding a dopant gas, such as phosphine ($PH_3$), to the deposition gas silane ($SiH_4$). Next, the multilayer is patterned using photoresist masking and anisotropic etching to form the array of bottom electrodes for the DRAM cells. Portions of the multilayer are left over each planned stacked capacitor area. These portions also extend into the node contact, making contact with the source/drain contact area, and the bottom electrodes have vertical sidewalls resulting from the anisotropic etching. A key feature of this invention is the method of recessing the third doped polysilicon layer. This method uses an isotropic plasma etch (dry-etch) process sequentially in the same etching chamber in which the bottom electrodes are formed using anisotropic etching, or alternatively, the sequential processing can be carried out in a multichamber or cluster tool, thereby providing a more manufacturable process at a lower cost. The patterning of the multi-polysilicon layer is achieved by operating the etcher in the reactive ion etch (RIE) mode, while the isotropic etching is carried out in the same etch chamber using higher pressures. The isotropic etch results in recessing the doped polysilicon layer in the sidewalls of the patterned portions for the bottom electrode, thereby increasing the surface area of the bottom electrode of the stacked capacitor. The doped third polysilicon layer is recessed by selectively removing by isotropic plasma etching using a sulphur hexafluoride ($SF_6$) gas, but preferably using a gas mixture containing hydrogen bromide (HBr) and sulphur hexafluoride ($SF_6$) to enhance the selectivity between the doped and undoped polysilicon. The undoped second and fourth polysilicon layers are then doped by out-diffusing from the heavily doped third polysilicon layer during the following high-temperature process steps, such as silicon oxide/silicon nitride/silicon oxide (ONO) oxidation and BPTEOS flow, thereby completing the bottom electrode structure. A thin dielectric layer is formed on the surface of the bottom electrode. Preferably this dielectric layer is composed of ONO or other high dielectric constant insulating layer, such as tantalum pentoxide ($Ta_2O_5$), to enhance the capacitance. A fifth polysilicon layer, which is heavily doped in-situ with N-type dopants, such as phosphorus, is deposited over the bottom electrode and elsewhere on the substrate. The stacked capacitor for the DRAM is now completed by patterning the fifth polysilicon layer to form the top electrodes for the stacked capacitors. Typically a borophosphosilicate glass is deposited, for example using a boron and phosphorus doped tetraethosiloxane (BPTEOS), and is used to electrically insulate the top electrode, and is annealed to form a planar surface. Although the invention is described for a bottom electrode formed from three polysilicon layers, the number of layers alternately doped and undoped can be increased to further increase the surface area of the bottom electrode.

BRIEF DESCRIPTION OF THE DRAWINGS

The objects and other advantages of this invention are best explained in the preferred embodiments with reference to the attached drawings in FIGS. 1 through 8, which are now briefly described.

FIG. 1 is a schematic cross-sectional view of a single memory cell for a prior-art DRAM device having a bottom capacitor electrode formed from a single polysilicon layer.

FIGS. 2 through 6 are schematic cross-sectional views depicting the sequence of process steps for forming the improved DRAM cell having increased capacitance and formed by consecutive anisotropic plasma etching and isotropic plasma etching in the same etching chamber, by the method of the first embodiment.

DESCRIPTION OF THE PREFERRED EMBODIMENTS

Figure 3:
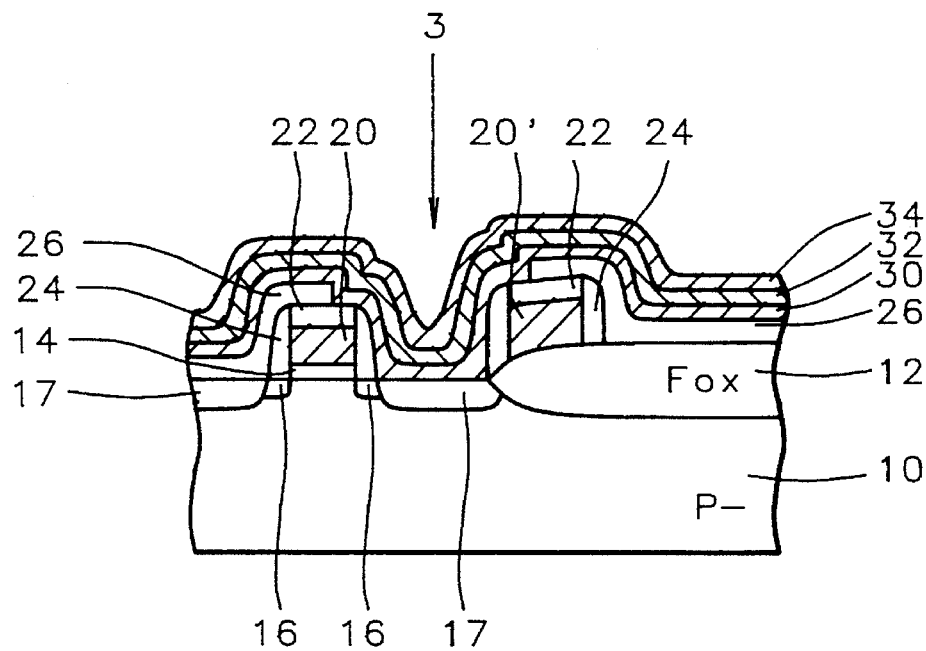

The principal objects and advantages of the present invention are now described for making a DRAM stacked storage capacitor with increased capacitance and having a more cost-effective manufacturing process. It should be well understood by those skilled in the art that additional semiconductor devices can be formed on the substrate, such as P- and N-channel FETs that are commonly used for making CMOS circuits for the read/write access circuits on the periphery of the DRAM chip.

Starting with FIG. 2, a schematic cross-sectional view of a portion of a substrate 10 is shown having a partially completed dynamic random access memory (DRAM) cell on which is formed the stacked capacitor. The most commonly used substrates for DRAMs are composed of a P-type single-crystal silicon having a <100> crystallographic orientation. A patterned, relatively thick Field OXide (FOX) 12 is formed on and in the surface of the substrate to surround and electrically isolate device areas in which the field effect transistors for the DRAM circuit are built. Only a single DRAM cell is depicted in FIG. 2, along with a portion of the field oxide 12. The method commonly practiced in the industry to form the field oxide 12 is by LOCal Oxidation of Silicon (LOCOS). The process steps for forming the LOCOS are not depicted in the figures, but consist of depositing a thin, stress-release silicon oxide layer and a thicker silicon nitride layer on the substrate 10. The silicon nitride layer is then patterned by conventional photolithography and plasma etching, leaving portions of the nitride layer over the device areas as a barrier mask to oxidation. The exposed field oxide areas are then thermally oxidized, such as by steam oxidation, to form field oxide regions 12 having a thickness of between about 4500 and 5500 Angstroms, as shown in FIG. 2. The silicon nitride masking layer and the stress-release oxide layer are removed by using, for example, a heated solution of phosphoric acid ($H_3PO_4$) to remove the nitride layer, and a dilute solution of hydrofluoric (HF) acid to remove the oxide layer.

After removing the silicon nitride layer and stress-release oxide layer, the FETs for the array of DRAM cells are then fabricated in the device areas. Typically the transistor used in the DRAM cell is an N-channel FET and is now briefly described. The device areas on the silicon substrate surface are carefully cleaned, and a good quality thermal oxide is grown in the device areas to form a thin gate oxide 14 for the FETs, as shown in FIG. 2. Typically the gate oxide is formed by thermal oxidation in a dry oxygen ambient. Only a portion of the gate oxide 14 remains after further processing, as shown in FIG. 2. Typically the gate oxide 14 is grown to a thickness of between about 60 and 150 Angstroms.

A blanket first polysilicon layer 20 is deposited over the device areas and elsewhere over the field oxide areas 12, and later patterned to form the FET gate electrodes 20 and word lines 20', as shown in FIG. 2. Layer 20 is deposited by low-pressure chemical vapor deposition using, for example, a reactant gas such as silane ($SiH_4$). The thickness of the first polysilicon layer 20 is in the range of about 1500 to 3000 Angstroms. Typically the first polysilicon layer 20 is heavily doped with an N-type electrically conducting dopant such as arsenic (As) or phosphorus (P) having a concentration in the range of about 1.0 E 19 to 1.0 E 21 atoms/cm$^3$. A first insulating layer 22 is then deposited on the first polysilicon layer 20. Typically the insulating layer 22 is composed of silicon oxide ($SiO_2$) and has a thickness of about 1000 to 3000 Angstroms. Layer 22 can be deposited by LPCVD using, for example, the decomposition of a reactant gas, such as tetraethosiloxane ($Si(OC_2H_5)$), commonly referred to as TEOS. Layers 20 and 22 are then patterned, using conventional photolithographic techniques and anisotropic plasma etching, to form the gate electrodes 20 on the device areas, while the word lines 20' are formed over the field oxide areas 12.

Still referring to FIG. 2, N$^-$ lightly doped drain (LDD) areas 16 are formed next by ion-implanting an N-type dopant adjacent to the gate electrodes, wherein the gate electrodes serve as a block-out mask for aligning the ion implant to the gate electrode 20, and an additional patterned photoresist masking step can be used to prevent implantation in other areas on the substrate. Typically, a phosphorus ion ($P^{31}$) implant is used having a dose in the range of 1.0 E 13 to 1.0 E 14 ions/cm$^2$, and the ion implant energy is in the range of about 20 to 40 keV.

After forming the LDD regions 16, insulating sidewall spacers 24, as shown in FIG. 2, are formed on the sidewalls of the gate electrodes 20 to insulate the electrode sidewalls, and also to provide an alignment mask for the heavily N$^+$ doped source/drain contact areas (regions) which are formed next. The insulating sidewalls 24 are preferably formed by blanket depositing an oxide, such as an LPCVD oxide using TEOS in the temperature range of about 650° to 800° C. The LPCVD oxide is then anisotropically plasma etched-back to the substrate to form the sidewall spacers 24 on the sidewalls of the FET gate electrode structure patterned from layers 14, 20, and 22.

The FET source/drain contact areas 17 are now formed in the single-crystal silicon substrate 10 adjacent to the sidewall spacers 24. Typically an arsenic ($As^{75}$) ion implantation is used to form the heavily doped N$^+$ areas 17 having a concentration dose in the range of about 2.0 E 15 to 1.0 E 16 ions/cm$^2$ and an ion implant energy of between about 20 and 70 keV. This completes the FETs for the DRAM memory cells.

A second insulating layer 26 composed of silicon oxide ($SiO_2$), or alternatively composed of silicon oxide and silicon nitride, is deposited over the FETs gate electrode structure consisting of patterned layers 14, 20, 22 and the spacers 24, the source/drain contact areas 17, and elsewhere on the substrate over the field oxide areas 12. The silicon oxide Layer 26 is preferably deposited by LPCVD using also a reactant gas such as TEOS. Alternatively if a silicon nitride layer is included, then the silicon nitride can be deposited at a temperature in the range of about 700° to 800° C. using a reactant gas mixture of dichlorosilane ($SiCl_2H_2$) and ammonia ($NH_3$). The preferred thickness of the second insulating layer 26 is from about 1000 to 3000 Angstroms.

Conventional photolithographic techniques and plasma etching are now used to form the node contact openings for the stacked capacitor in the second insulating layer 26 over one of the two source/drain contact areas 17 of each FET in each of the DRAM memory cells. Only one of the openings 3 is depicted in FIG. 2 to simplify the drawing and the discussion. Opening 3 is also preferably etched open in layer 26 over the gate electrode 20 and over the adjacent word line 20' to form a self-aligned contact to the source/drain contact areas 17.

Referring now to FIGS. 3 through 6, the method of forming the DRAM storage capacitor structure by the method of this invention is described. The bottom electrode for the stacked capacitor is made in the same LPCVD reactor by sequentially depositing a multilayer consisting of a second undoped polysilicon layer 30, a heavily doped third polysilicon layer 32, and a fourth undoped polysilicon layer 34 on the second insulating layer 26 and in the node contact opening 3. The multilayer is preferably deposited in a low-pressure chemical vapor deposition (LPCVD) system, wherein the third polysilicon layer 32 is heavily doped with N-type impurities by adding a dopant gas, such as phosphine ($PH_3$), to the deposition gas, such as silane ($SiH_4$). The deposition is performed at a temperature in the range of about 550° to 600° C. The polysilicon layer 32 is preferably doped with phosphorus (P) to a concentration in the range of about 1.0 E 19 to 1.0 E 21 atoms/cm$^3$. The preferred thickness of polysilicon layers 30, 32, and 34 is in a range of about 500 to 2500 Angstroms.

The next two process steps of patterning the multilayer and recessing the third polysilicon layer 32 to increase the capacitance are carried out sequentially in the same etch chamber. This improves the process time and reduces the possibility of contamination.

Figure 4:
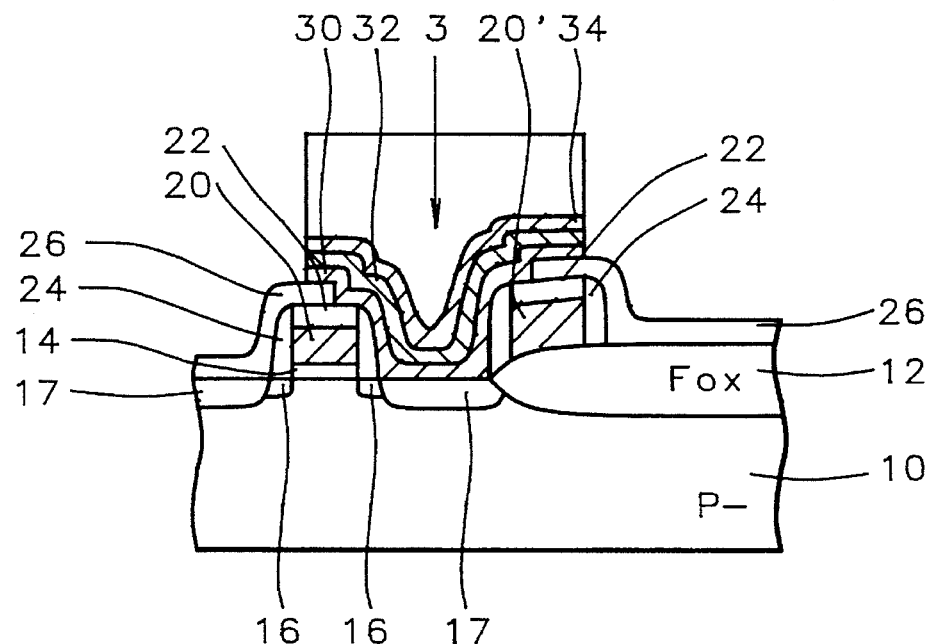

Referring now to FIG. 4, the multilayer consisting of polysilicon layers 30, 32, and 34 is patterned using a photoresist masking 36 and anisotropic etching to form the array of bottom electrodes for the DRAM cells. Only one of the bottom electrodes is shown in FIG. 4 to simplify the drawing and the discussion. This multilayer is patterned leaving portions in each cell area extending over and into the node contact openings, such as opening 3, and thereby contacting the source/drain contact area 17. The patterned multilayer also extends over the gate electrode 20 and word line 21, and is anisotropically etched to the second insulating layer 26 forming vertical sidewalls in the multilayer.

The multilayer is preferably patterned using a single-wafer plasma etcher operating in the reactive ion etch (RIE) mode to achieve essentially vertical sidewalls in the multilayer, also shown in FIG. 4. In the RIE mode the silicon substrate (wafer) is placed on the substrate electrode in the plasma etcher (not shown). Radio frequency (RF) power, of 13.56 Megahertz (MHz), is applied to the substrate electrode through a blocking capacitor. This provides a self-biasing DC voltage to develop on the substrate electrode, resulting in ion-assisted directional (anisotropic) etching. The preferred etching gas is a mixture of hydrogen bromide (HBr) and chlorine ($Cl_2$). More specifically the plasma etching is carried out in a plasma etcher such as model P5000, manufactured by Applied Materials, Inc. of U.S.A. The preferred pressure in the process chamber during etching is typically between about 20 and 500 milliTorr, the RF power is typically between about 100 and 1000 Watts, and the flow rates of the HBr and $Cl_2$ gas are between about 20 and 100 standard cubic centimeters per minute (sccm), and between about 20 and 100 sccm, respectively.

Figure 5:
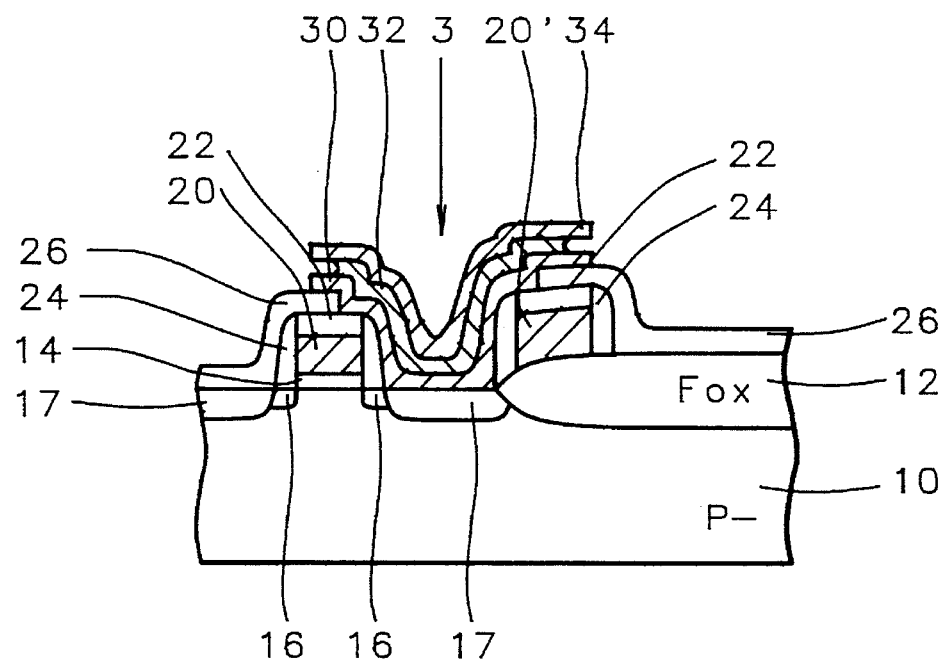

After completing the anisotropic etching to form the bottom electrodes from the multilayer, shown in FIG. 4, the heavily N+ doped third polysilicon layer 32 is laterally recessed in the same etching chamber. This sequential etching in the same chamber reduces the etching complexity and the processing time. The plasma etch chamber is now converted to the isotropic plasma etch mode, and is used to recess layer 32 and increase the surface area of the bottom electrodes, as shown in FIG. 5.

Figure 8:
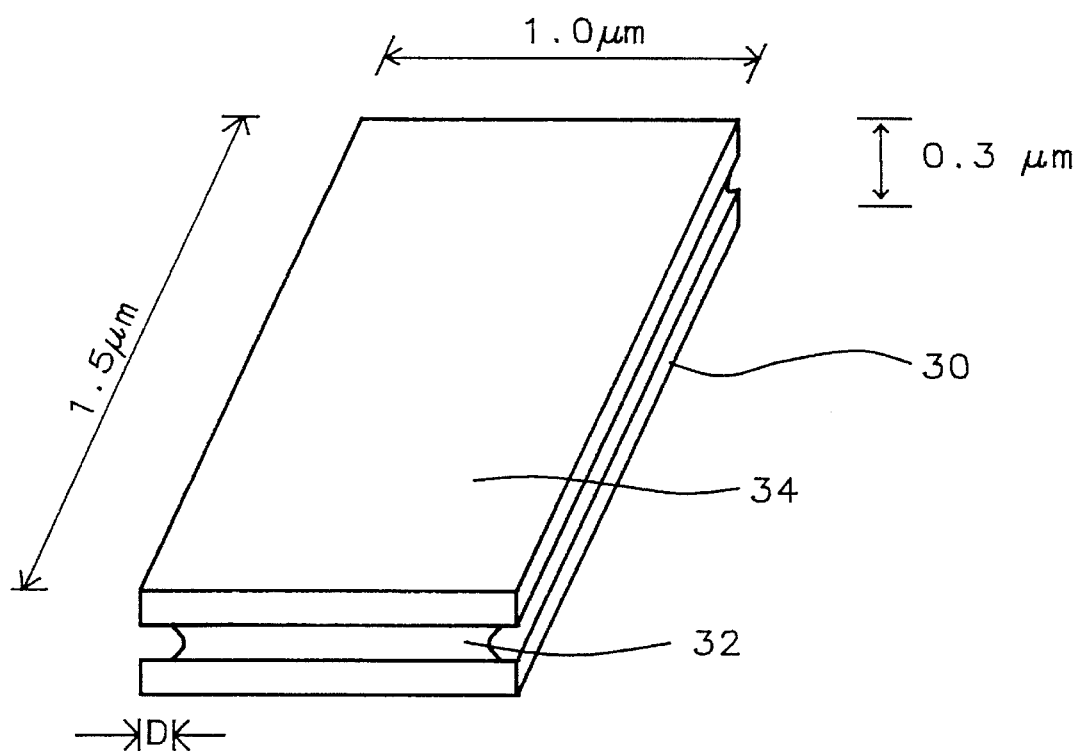
FIG. 8 is an aerial view of the bottom electrode for a stacked capacitor by the method of this invention.

Shown in FIG. 8 is one possible shape for a bottom electrode and some typical dimensions are given to demonstrate the increase in capacitor area that can be achieved over the prior-art flat stacked capacitor of FIG. 1 having comparable dimensions. Therefore, by way of example only, if the top surface of the DRAM bottom electrode (layer 34) is $1.0 \times 1.5$ micrometers$^2$ (um$^2$) in area, as shown in the aerial view of FIG. 8, and each of the polysilicon layers 30, 32, and 34 is 0.1 um thick, then a recess D having depth of 0.1 um in layer 32 results in a 33% increase in electrode area, and a recess D of 0.15 um results in a 50% increase in area over the flat capacitor of the prior art having comparable top surface area and total thickness (0.3 um). The capacitance (C=keA/d, where k is the dielectric constant, e is the absolute permittivity of free space, A is electrode area, and d is the thickness of the inter-electrode dielectric layer) for the prior-art capacitor is 23 femtoFarads (fF), while the capacitance for the capacitor having the recess D=0.1 um is 30.59 fF, and the capacitor having D =0.15 is 34.50 fF.

After evacuating the HBr and $Cl_2$ gases used for the anisotropic etch from the etching chamber, a gas, such as sulfurhexafluoride ($SF_6$) is introduced. Preferably a gas mixture of $SF_6$ and HBr is used for the isotropic etching to enhance the etch rate selectivity of the $N^+$ doped third polysilicon layer 32 to the undoped second and fourth polysilicon layers, layers 30 and 34, respectively. The preferred flow rates for the HBr is between about 10 and 100 sccm, and the flow rate of the $SF_6$ is between about 10 and 100 sccm, while the chamber pressure is maintained in a range of between about 100 and 1000 milliTorr. The RF power is preferably between about 100 and 1000 Watts. Typically the etch rate selectivity (ratio) of the doped to the undoped polysilicon is in a range of about 2:1 to 5:1. Alternatively, the anisotropic and isotropic plasma etching can be performed sequentially in a single-wafer multichamber (cluster) system in which the silicon substrate 10 is transported between etch chambers under vacuum, or in a non-oxidizing gas such as nitrogen or argon. Both methods substantially reduce the process times, process materials, and manufacturing costs over the prior art where a wet etch is used to recess the polysilicon. The photoresist layer 36 is now removed by plasma ashing in a low-pressure oxygen ambient, for example, by using a third chamber in the cluster tool as a plasma asher.

The undoped second and fourth polysilicon layers 30 and 34, respectively, are then uniformly doped by out-diffusing the phosphorus (P) from the heavily doped third polysilicon layer 32 during subsequent high-temperature processing steps, thereby completing the bottom electrode structure for the stacked capacitor. The uniformly doped polysilicon layers 30, 32, and 34 in FIG. 5 are depicted as a single bottom electrode 7 structure in FIG. 6. The out-diffusion of the $N^+$ dopant into layer 30 in FIG. 5 also forms the low-resistance node contact between the bottom electrode 7 and the source/drain contact areas 17, as shown in FIG. 6.

The out-diffusion of the $N^+$ dopant is achieved during subsequent high-temperature processing steps.

Figure 6:
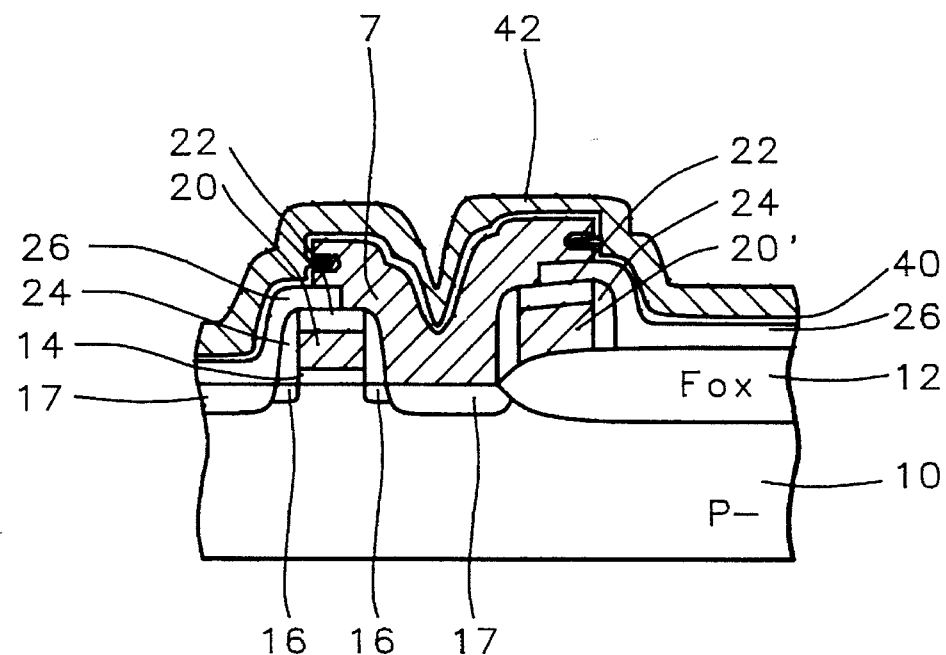

Referring still to FIG. 6, a thin inter-electrode dielectric layer 40 is formed on the surface of the bottom electrode. The dielectric layer is preferably composed of an insulator having a high dielectric constant, such as a silicon oxide-silicon nitride-silicon oxide (ONO). The ONO is typically between 50 and 100 Angstroms thick. Alternatively, other insulating layers having high dielectric constants, such as tantalum pentoxide ($Ta_2O_5$), can be used to enhance the capacitance. A fifth polysilicon layer, which is heavily doped in-situ with N-type dopants such as phosphorus, is deposited over the bottom electrode and elsewhere on the substrate.

The array DRAM stacked capacitors is now completed by patterning the fifth polysilicon layer 42 to form the top electrodes for the stacked capacitors. The polysilicon layer 42 is preferably between about 1000 and 2000 Angstroms thick, and is also heavily doped with phosphorus to a concentration of about 1.0 E 19 to 1.0 E 21 atoms/cm$^3$ to provide good conductivity. Typically a borophosphosilicate glass is deposited, for example using a boron and phosphorus doped tetraethosiloxane (BPTEOS) layer, and is used to electrically insulate the top electrodes, and is annealed to form a planar surface. The BPTEOS layer is not depicted in FIG. 7.

Figure 7:
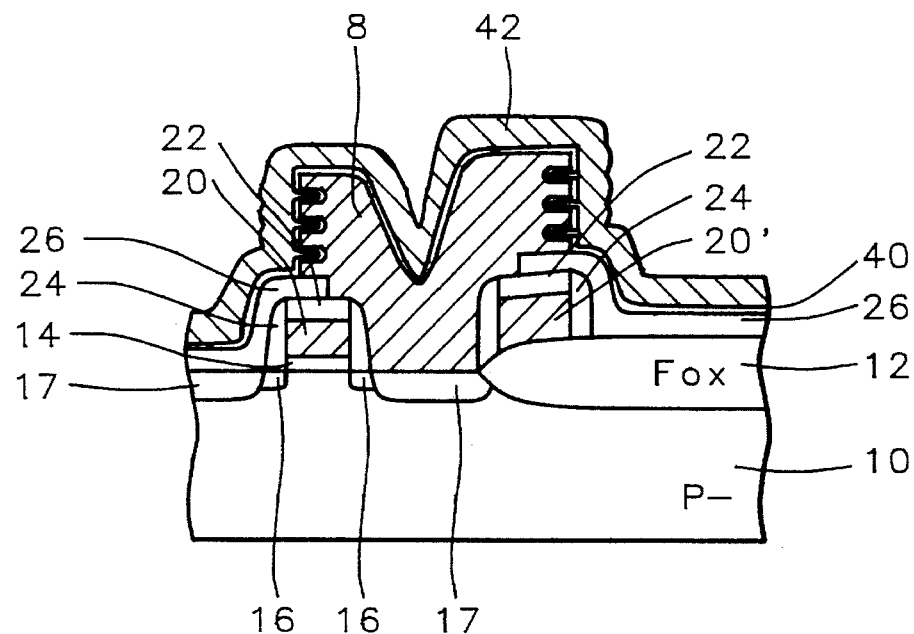
FIG. 7 is a schematic cross-sectional view of a capacitor for a second embodiment which further increases the capacitance by including additional polysilicon layers to the bottom electrode of the stacked capacitor.

Referring to FIG. 7, a second embodiment of the invention is shown which further increases the individual cell capacitance. The method is similar to the process for a first embodiment, and therefore similar layers are identically labeled. The further improvement consists of providing additional layers of undoped and in-situ doped polysilicon during the LPCVD deposition of the multilayer, shown in FIG. 3. For example, FIG. 7 depicts a bottom electrode 8 composed of four undoped layers and three in-situ doped layers. The bottom electrode structure 8 is shown after the out-diffusion of the phosphorus, and is depicted in FIG. 7 as a single fin-shaped structure. The process complexity is only marginally increased since only four new polysilicon layers are deposited in situ, and the anisotropic and isotropic plasma etch processes are identical to the first embodiment.

While the invention has been particularly shown and described with reference to the preferred embodiments thereof, it will be understood by those skilled in the art that various changes in form and detail may be made without departing from the spirit and scope of the invention.

What is claimed is:

1. A method for fabricating a dynamic random access memory device having stacked storage capacitors, comprising the steps of:

providing a semiconductor substrate having field oxide areas in and on said substrate surface surrounding and electrically isolating device areas for field effect transistors;

forming a gate oxide on said device areas;

depositing a first polysilicon layer on said device areas and elsewhere on said field oxide areas;

depositing a first insulating layer on said first polysilicon layer; and patterning said first insulating layer and said first polysilicon layer, and thereby forming gate electrodes over said device areas and word lines elsewhere over said field oxide areas;

doping by ion implantation said device areas adjacent to said gate electrodes, and thereby forming lightly doped source/drain regions;

blanket depositing and anisotropically etching back a sidewall spacer insulating layer, and thereby forming sidewall spacers on said gate electrodes;

doping by ion implantation said device areas adjacent to said sidewall spacers forming source/drain contact areas, and thereby completing said field effect transistors;

depositing a second insulating layer over said device areas and field oxide areas and then forming said stacked storage capacitors by, etching contact openings in said second insulating layer to one source/drain contact area of each of said field effect transistors, depositing a second undoped polysilicon layer, a third doped polysilicon layer, and a fourth undoped polysilicon layer on said second insulating layer and in said contact openings, wherein all said depositions are carried out consecutively in the same deposition tool by adding a dopant gas to the deposition gas during said third polysilicon layer deposition;

patterning by photoresist masking and anisotropic plasma etching said second, third, and fourth polysilicon layers leaving portions over the planned capacitor areas that include said contact openings, and removing selectively by isotropic plasma etching and thereby recessing said third doped polysilicon layer under said patterned fourth polysilicon layer and thereby forming bottom electrodes for said stacked storage capacitors, doping remaining portions of said bottom electrodes, forming a conformal capacitor dielectric layer over said bottom electrodes, depositing a fifth polysilicon layer over said bottom electrodes having said dielectric layer, patterning said fifth polysilicon layer to complete said stacked storage capacitors.

2. The method of claim 1, wherein the thickness of said second polysilicon layer is between 500 and 2000 Angstroms.

3. The method of claim 1, wherein the thickness of said third polysilicon layer is between 1000 and 2500 Angstroms.

4. The method of claim 1, wherein the thickness of said fourth polysilicon layer is between 500 and 2500 Angstroms.

5. The method of claim 1, wherein said third doped polysilicon layer is deposited by in-situ doping using a phosphorus dopant and having a concentration in the range of about 100 E 19 to 1.0 E 21 atoms/cm$^3$.

6. The method of claim 1, wherein said anisotropic plasma etching is carried out in an etchant gas composed of hydrogen bromide (HBr) and chlorine (Cl$_2$).

7. The method of claim 1, wherein said isotropic plasma etching is performed in a sulphur hexafluoride (SF$_6$) gas.

8. The method of claim 1, wherein said isotropic plasma etching is carried out in a gas mixture of hydrogen bromide (HBr) and sulphur hexafluoride (SF$_6$), where the flow rate of said HBr is between about 10 and 100 cubic centimeters per minute (ccm) and the flow rate of said SF$_6$ is between about 10 and 100 ccm.

9. The method of claim 8, wherein said isotropic plasma etching is carried out in said gas mixture at a gas pressure in the range of about 100 to 1000 milliTorr.

10. The method of claim 8, wherein the etch rate ratio of said doped third polysilicon layer to said second and fourth undoped polysilicon layers is between about 2:1 and 5:1.

11. The method of claim 1, wherein said anisotropic plasma etching and said isotropic plasma etching are carried out sequentially in the same etching chamber, thereby reducing time and cost.

12. The method of claim 1, wherein said undoped second and fourth polysilicon layers are made uniformly doped by out-diffusing said dopants from said third polysilicon layer at a temperature of between 800° and 900° C. for a time of between about 20 and 60 minutes.

13. A method for fabricating a dynamic random access memory device having stacked storage capacitors, comprising the steps of:

providing a semiconductor substrate having field oxide areas in and on said substrate surface surrounding and electrically isolating device areas for field effect transistors;

forming a gate oxide on said device areas;

depositing a first polysilicon layer on said device areas and elsewhere on said field oxide areas;

depositing a first insulating layer on said first polysilicon layer; and patterning said first insulating layer and said first polysilicon layer, and thereby forming gate electrodes over said device areas and word lines elsewhere over said field oxide areas;

doping by ion implantation said device areas adjacent to said gate electrodes, and thereby forming lightly doped source/drain regions;

blanket depositing and anisotropically etching back a sidewall spacer insulating layer, and thereby forming sidewall spacers on said gate electrodes;

doping by ion implantation said device areas adjacent to said sidewall spacers forming source/drain contact areas, and thereby completing said field effect transistors;

depositing a second insulating layer over said device areas and field oxide areas and then forming said stacked storage capacitors by, etching contact openings in said second insulating layer to one source/drain contact area of each of said field effect transistors, depositing a second undoped polysilicon layer, a third doped polysilicon layer, and a fourth undoped polysilicon layer on said second insulating layer and in said contact openings, wherein all said depositions are carried out consecutively in the same deposition tool by adding a dopant gas containing phosphorus impurities to the deposition gas during said third polysilicon layer deposition, having a concentration in the range of between 1.0 E 19 and 1.0 E 21 atoms/cm$^3$, patterning by photoresist masking and anisotropic plasma etching said second, third, and fourth polysilicon layers leaving portions over the planned capacitor areas that include said contact openings, and removing selectively by isotropic plasma etching using a gas mixture of hydrogen bromide (HBr) and sulphur hexafluoride (SF$_6$) and thereby recessing said third doped polysilicon layer under said patterned fourth polysilicon layer and thereby forming bottom electrodes for said stacked storage capacitors, doping remaining portions of said bottom electrodes, forming a conformal capacitor dielectric layer over said bottom electrodes, depositing a fifth polysilicon layer over said bottom electrodes having said dielectric layer, patterning said fifth polysilicon layer to complete said stacked storage capacitors.

14. The method of claim 13, wherein the thickness of said second polysilicon layer is between 500 and 2000 Angstroms.

15. The method of claim 13, wherein the thickness of said third polysilicon layer is between 1000 and 2500 Angstroms.

16. The method of claim 13, wherein the thickness of said fourth polysilicon layer is between 500 and 2000 Angstroms.

17. The method of claim 13, wherein said anisotropic plasma etching is carried out in an etchant gas composed of hydrogen bromide (HBr) and chlorine ($Cl_2$).

18. The method of claim 13, wherein said isotropic plasma etching is performed in a sulphur hexafluoride ($SF_6$) gas.

19. The method of claim 13, wherein said hydrogen bromide (HBr) has a flow rate of between about 10 and 100 standard cubic centimeters/minute (sccm), and sulphur hexafluoride ($SF_6$) has a flow rate of between about 10 and 100 sccm.

20. The method of claim 13, wherein said isotropic plasma etching is carried out in said gas mixture at a gas pressure in the range of about 100 to 1000 milliTorr.

21. The method of claim 13, wherein the etch rate ratio of said isotropic plasma etch of said doped third polysilicon layer to said second and fourth undoped polysilicon layers is between about 2:1 and 5:1.

22. The method of claim 13, wherein said anisotropic plasma etching and said isotropic plasma etching are carried out sequentially in the same etching chamber, thereby reducing time and cost.

23. The method of claim 13, wherein said undoped second and fourth polysilicon layers are made uniformly doped by out-diffusing said dopants from said third polysilicon layer by annealing at a temperature between about 800° and 900° C. for a time of between about 20 and 60 minutes.

* * * * *